(12) United States Patent
Liu

(10) Patent No.: US 8,441,855 B2
(45) Date of Patent: May 14, 2013

(54) STRINGS OF MEMORY CELLS HAVING STRING SELECT GATES, MEMORY DEVICES INCORPORATING SUCH STRINGS, AND METHODS OF ACCESSING AND FORMING THE SAME

(75) Inventor: Zengtao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 191 days.

(21) Appl. No.: 13/006,762

(22) Filed: Jan. 14, 2011

(65) Prior Publication Data
US 2012/0182805 A1 Jul. 19, 2012

(51) Int. Cl.
*G11C 7/10* (2006.01)
(52) U.S. Cl.
USPC .......... 365/185.17; 365/185.11; 365/185.01; 365/185.14
(58) Field of Classification Search .......... 365/185.17, 365/185.01, 185.11, 185.14
See application file for complete search history.

(56) References Cited

U.S. PATENT DOCUMENTS

| 5,877,537 | A | 3/1999 | Aoki |
| 6,998,314 | B2 | 2/2006 | Prall |
| 7,005,350 | B2 | 2/2006 | Walker et al. |
| 7,679,133 | B2 | 3/2010 | Son et al. |
| 7,820,516 | B2 | 10/2010 | Yang et al. |
| 2005/0063237 | A1 | 3/2005 | Masuoka et al. |
| 2007/0252201 | A1 | 11/2007 | Kito et al. |
| 2008/0296659 | A1 | 12/2008 | Park et al. |
| 2009/0310415 | A1 | 12/2009 | Jin et al. |
| 2010/0090188 | A1 | 4/2010 | Futatsuyama |
| 2010/0097859 | A1 | 4/2010 | Shim et al. |
| 2010/0207190 | A1 | 8/2010 | Katsumata et al. |
| 2011/0013454 | A1 * | 1/2011 | Hishida et al. ........... 365/185.11 |

* cited by examiner

*Primary Examiner* — Thong Q Le
(74) *Attorney, Agent, or Firm* — Leffert Jay & Polglaze, P.A.

(57) ABSTRACT

Strings of memory cells having a string select gate configured to selectively couple ends of a string to a data line and a source line concurrently, memory devices incorporating such strings and methods for accessing and forming such strings are provided. For example, non-volatile memory devices are disclosed that utilize vertical structure NAND strings of serially-connected non-volatile memory cells. One such string including two or more serially-connected non-volatile memory cells where each end of the string shares a string select gate with the other end of the string is disclosed.

37 Claims, 14 Drawing Sheets

US 8,441,855 B2

STRINGS OF MEMORY CELLS HAVING STRING SELECT GATES, MEMORY DEVICES INCORPORATING SUCH STRINGS, AND METHODS OF ACCESSING AND FORMING THE SAME

TECHNICAL FIELD

The present disclosure relates generally to semiconductor memories and, in particular, in one or more embodiments, the present disclosure relates to NAND memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged and accessed. Typically, the array of memory cells for NAND flash memory devices is arranged such that memory cells of a string are connected together in series, source to drain.

To meet demands for higher capacity memories, designers continue to strive for increasing memory density, i.e., the number of memory cells for a given area of an integrated circuit die. One way to increase density is to reduce the feature size of individual memory cells. However, as device size decreases, the thickness of the tunnel dielectric layer must also generally decrease. This, in turn, results in increasing risk of failure in the tunnel dielectric and charge leakage from the storage node. Alternatively, memory density can be increased by stacking multiple layers of memory arrays on top of one another. However, forming semiconductor layers of sufficient quality to serve as active areas of the arrays becomes problematic and costly. Another proposal has been to form NAND arrays vertically around semiconductor pillars, which act as the channel regions of the NAND strings.

For the reasons stated above, and for other reasons stated below which will become apparent to those skilled in the art upon reading and understanding the present specification, there is a need in the art for alternative memory device architectures.

DETAILED DESCRIPTION

Figure 1:
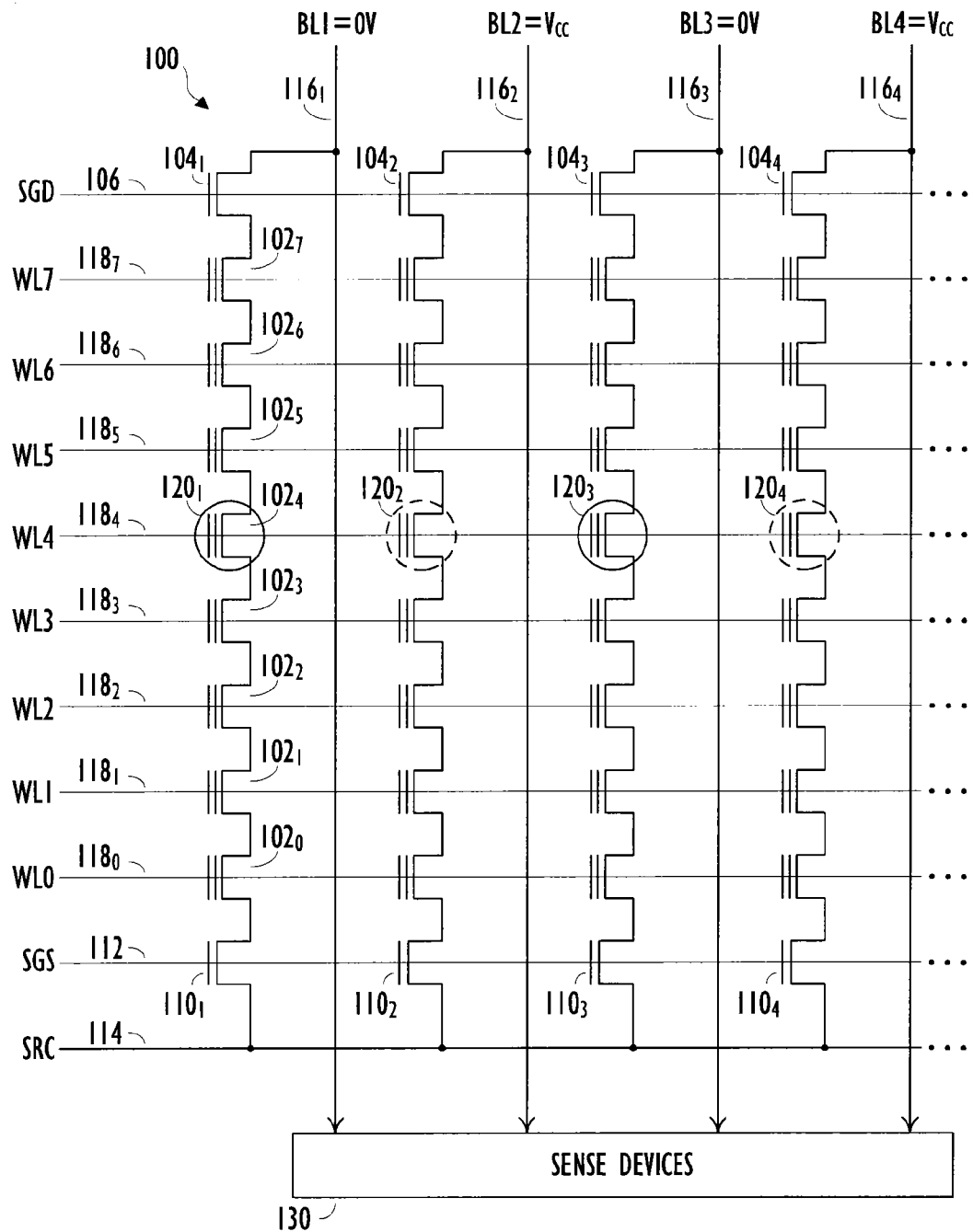
FIG. 1 shows a schematic representation of a typical NAND configured array of memory cells.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The term semiconductor can refer to, for example, a layer of material, a wafer, or a substrate, and includes any base semiconductor structure. "Semiconductor" is to be understood as including silicon on sapphire (SOS) technology, silicon on insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure. The following detailed description is, therefore, not to be taken in a limiting sense.

FIG. 1 illustrates a typical NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as one or more NAND strings of memory cells 102, for example. The memory cells 102 of the array are arranged together in strings (e.g., NAND strings), typically of 8, 16, 32, or more each. Memory cells of a string are connected together in series, source to drain, between a source line 114 and a data line 116, often referred to as a bit line. Each series string of memory cells is coupled to source line 114 by a source select gate such as select gates 110 and to an individual bit line 116 by drain select gates 104, for example. The source select gates 110 are controlled by a source select gate (SGS) control line 112 coupled to their control gates. The drain select gates 104 are controlled by a drain select gate (SGD) control line 106.

The one or more strings of memory cells are also typically arranged in groups (e.g., blocks) of memory cells.

The memory array 100 is accessed by a string driver (not shown) configured to activate a logical row of memory cells by selecting a particular access line 118, often referred to as a word line, such as WL7-WL0 $118_{7-0}$, for example. Each word line 118 is coupled to the control gates of a row of memory cells 120. Bit lines BL1-BL4 $116_1$-$116_4$ can be driven high or low depending on the type of operation being performed on the array. As is known to those skilled in the art, the number of word lines and bit lines might be much greater than those shown in FIG. 1.

Memory cells 102 may be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. By way of example, one bit (e.g., 1 or 0) may be represented by two Vt ranges, two bits by four ranges, three bits by eight ranges, etc.

Programming typically involves applying one or more programming pulses (Vpgm) to a selected word line, such as WL4 $118_4$, and thus to the control gate of each memory cell 120 coupled to the selected word line. Typical programming pulses (Vpgm) start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted for programming. More specifically, the floating gates are typically charged through direct injection or Fowler-Nordheim tunneling of electrons from the channel to the floating gate, resulting in a Vt typically greater than zero in a programmed state, for example. In the example of FIG. 1, a Vpass voltage is applied to each unselected word line $118_{7-5}$ and $118_{3-0}$. Vpass might be 10V, for example. The Vpass applied to each unselected word line might be different voltages. For example, a word line adjacent to the selected word line might be biased to a Vpass potential of 8V. The next adjacent word line might be biased to 7V and the next adjacent word line might be biased to 0V, for example. The Vpass voltages are not high enough to cause programming of memory cells biased with a Vpass voltage.

An inhibit voltage is typically applied to bit lines (e.g., Vcc) which are not coupled to a NAND string containing a memory cell that is targeted for programming. During a programming operation alternate bit lines may be enabled and inhibited from programming For example, even numbered bit lines might be enabled for programming memory cells coupled to even numbered bit lines while the odd numbered bit lines are inhibited from programming memory cells coupled to the odd numbered bit lines. A subsequent programming operation might then inhibit the even numbered bit lines and enable the odd numbered bit lines. For example, the memory cells of row 120 having solid line circles are selected for programming whereas the memory cells having dashed line circles are inhibited from programming as shown in FIG. 1.

Between the application of one or more programming (e.g., Vpgm) pulses, a verify operation is performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse Vpgm is applied if there are memory cells that have not completed programming. This process of applying a programming pulse followed by performing a verify operation continues until all the selected memory cells have reached their intended programmed states. If a particular number of programming pulses (e.g., maximum number) have been applied and one or more selected memory cells still have not completed programming, those memory cells might be marked as defective, for example.

Bit lines BL1-BL4 116 are coupled to sensing devices (e.g., sense amplifiers) 130 that detect the state of each cell by sensing voltage or current on a particular bit line 116. The word lines WL7-WL0 118 select the individual memory cells 102 in the series strings to be written to or read from, and operate the remaining memory cells in each series string in a pass through mode.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed, i.e., a vertical structure will be taken as extending away from the substrate surface, a bottom end of the vertical structure will be taken as the end nearest the substrate surface and a top end of the vertical structure will be taken as the end farthest from the substrate surface. Furthermore, as used herein, a vertical structure need not be perpendicular to the surface of the substrate and may form an acute angle with the surface of the substrate.

Figure 2A:
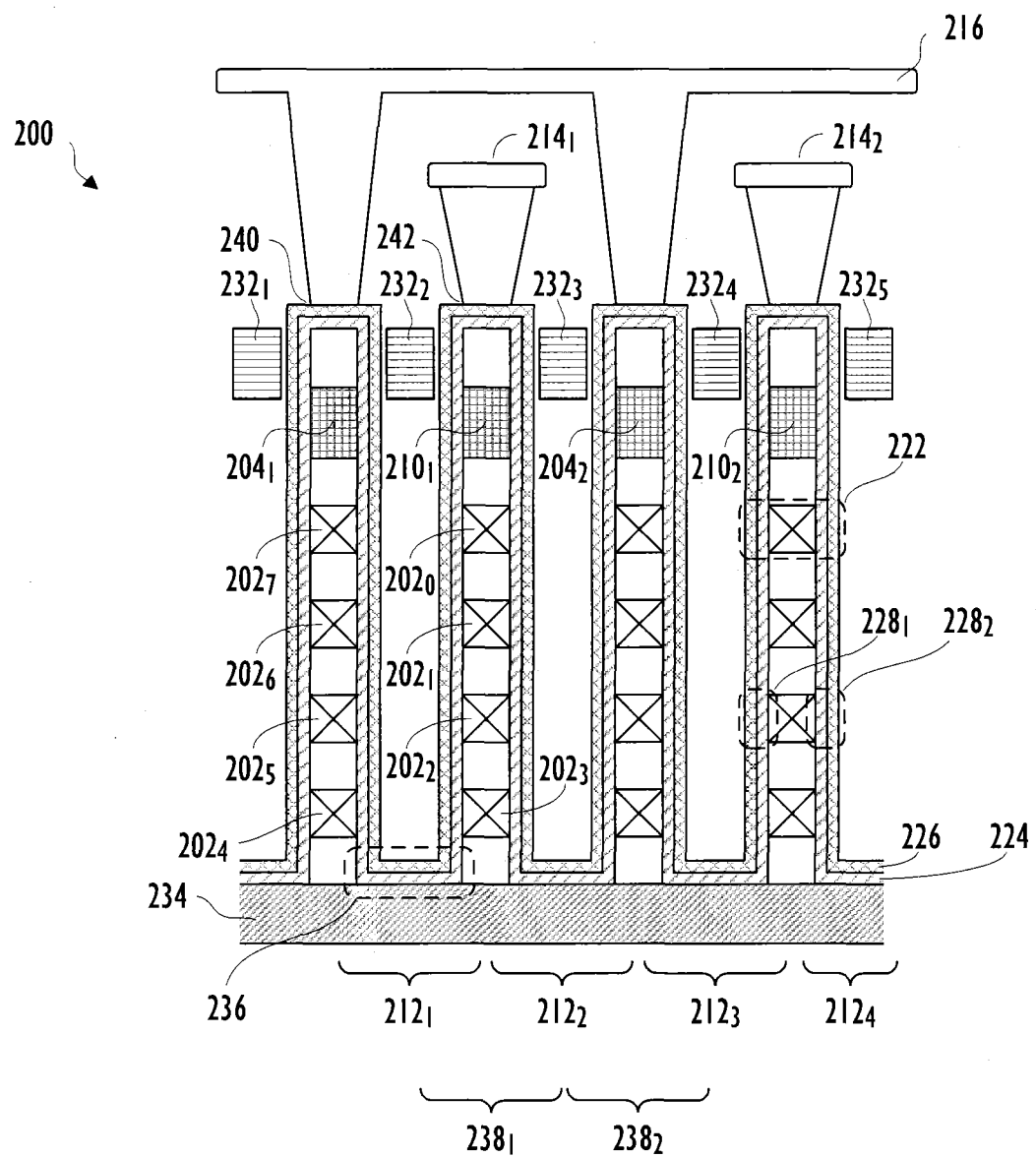
FIG. 2A is a cross-sectional view of a portion of a memory array according to an embodiment of the present disclosure.

FIG. 2A illustrates is a cross-sectional view of a plurality of memory cells formed in a plurality of strings 212 arranged in a NAND configuration according to various embodiments of the present disclosure. In particular, the memory cells, source select gates 210 and drain select gates 204 comprising strings 212 are formed in a folded arrangement such that a portion of each string is formed with a first portion formed along a first column $238_1$ and a second portion of the same string formed along an adjacent column $238_2$. Thus, strings 212 are formed in a folded (e.g., "U" shaped) arrangement according to various embodiments of the present disclosure. A string 212 according to one or more embodiments might comprise eight memory cells where four memory cells are formed along one vertical column (e.g., stack) and the remaining four memory cells of the string are formed in an adjacent vertical column, thus forming a "U" shaped arrangement. A memory device according to one or more embodiments of the present disclosure might comprise two or more of these "U" shaped strings 212 formed adjacent to each other. Between each end (e.g., top) of each of the strings is formed a self aligned string select gate 232.

FIG. 2A further illustrates that the strings $212_{1-4}$ are coupled between a bit line 216 and two source lines 214 according to various embodiments. It should be noted that only a portion of memory cell string $212_4$ is shown in the Figure. However, various embodiments according to the present disclosure are not so limited. For example, an array of memory cells 200 according to various embodiments might comprise many more strings 212. In addition, each string 212 might comprise fewer or more than eight memory cells such as coupled by word lines $202_{0-7}$. For example, additional memory cell structures (not shown), e.g., non-active or 'dummy' memory cells, might be located within each string of memory cells. These non-active memory cells might be located near region 236 (e.g., bottom) of a string and/or near the top of each string according to one or more embodiments of the present disclosure. The use of dummy memory cells in a string of memory cells has been depicted in U.S. Patent Application Publication 2009/0168513 A1 to Tanaka. Strings 212 according to various embodiments of the present disclosure might comprise different numbers of memory cells than those shown in FIG. 2A, such as $2^n$ memory cells where n is an integer, for example.

Further description of the configuration of each memory cell of the memory array 200 can be described by referring to reference numbers 222-228 of FIG. 2A. The dashed line 222 encompasses two memory cell structures. Dashed line $228_1$ encompasses a memory cell structure of string $212_3$ and dashed line $228_2$ encompasses a memory cell structure of partially shown string $212_4$, for example. The dashed line 222 further includes a charge storage structure 224 and a channel structure 226. It is shown that the charge storage structure 224 is a continuous layer throughout the memory strings 212 of FIG. 2A. For example, 224 might comprise a charge storage structure that might include a first oxide layer, a nitride layer formed on the oxide layer, and a second oxide layer formed on the nitride layer (not shown).

Figure 2B:
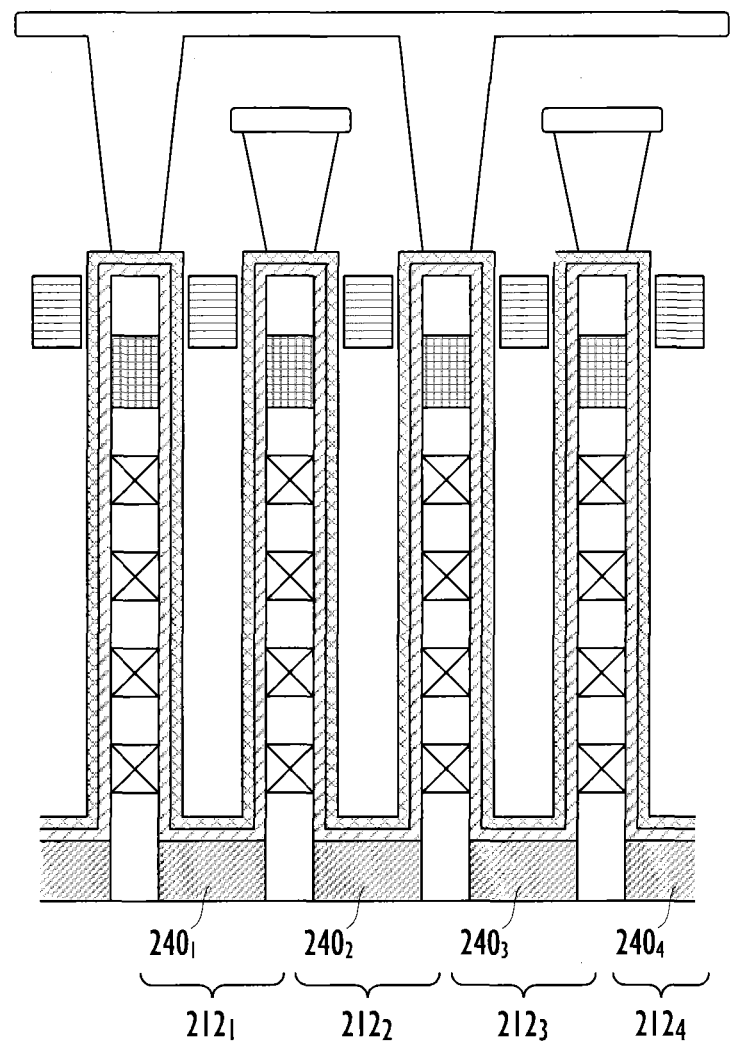
FIG. 2B is a cross-sectional view of a portion of a memory array according to an embodiment of the present disclosure.

FIG. 2A further illustrates a control gate, e.g., plane gate 234. The plane gate 234 might be configured to provide for biasing of the bottom of each U shaped string 212, such as in region 236, for example, to couple the bottom of each stack of strings $212_{1-4}$ together. The plane gate 234 might comprise a single conductive region adjacent the bottom of each string of the entire array of memory cells. However, the plane gate 234 might be omitted according to one or more embodiments (not shown.) For example, an embodiment having a narrow region 236 might not include a plane gate 234, for example, where conductivity can be maintained without such a plane gate 234. The plane gate 234 might alternatively comprise multiple control gates, e.g., one conductive region for each string, according to one or more embodiments of the present disclosure. FIG. 2B illustrates multiple control gates $240_{1-4}$ where each control gate is formed under a string of memory cells $212_{1-4}$, for example.

Referring again to FIG. 2A, the array of memory cells 200 might be a three-dimensional (3D) array of memory cells (not shown in FIG. 2A) according to various embodiments of the present disclosure. Thus, the memory cells, source/drain select gates and string select gates shown in cross sectional view in FIG. 2A might be repeated both behind (e.g., below) and in front of (e.g., above) the plane shown in FIG. 2A, for example. By way of further description, the word lines 202 which comprise both the word line signal line and locally the control gate structure of each memory cell 222 may be configured passing into and out of the plane of the memory cell array 200. Similarly, the drain side select gates 204, source side select gates 210 and the string select gates 232 may also comprise a control signal line passing through the plane of FIG. 2A and further function as the control gate structure locally in each string of memory cells. It should be noted that the word lines shown in FIG. 2A pass through the page in FIG. 2A in contrast with the word lines shown in FIG. 1, for example, which pass from left to right of the page.

Figure 3:
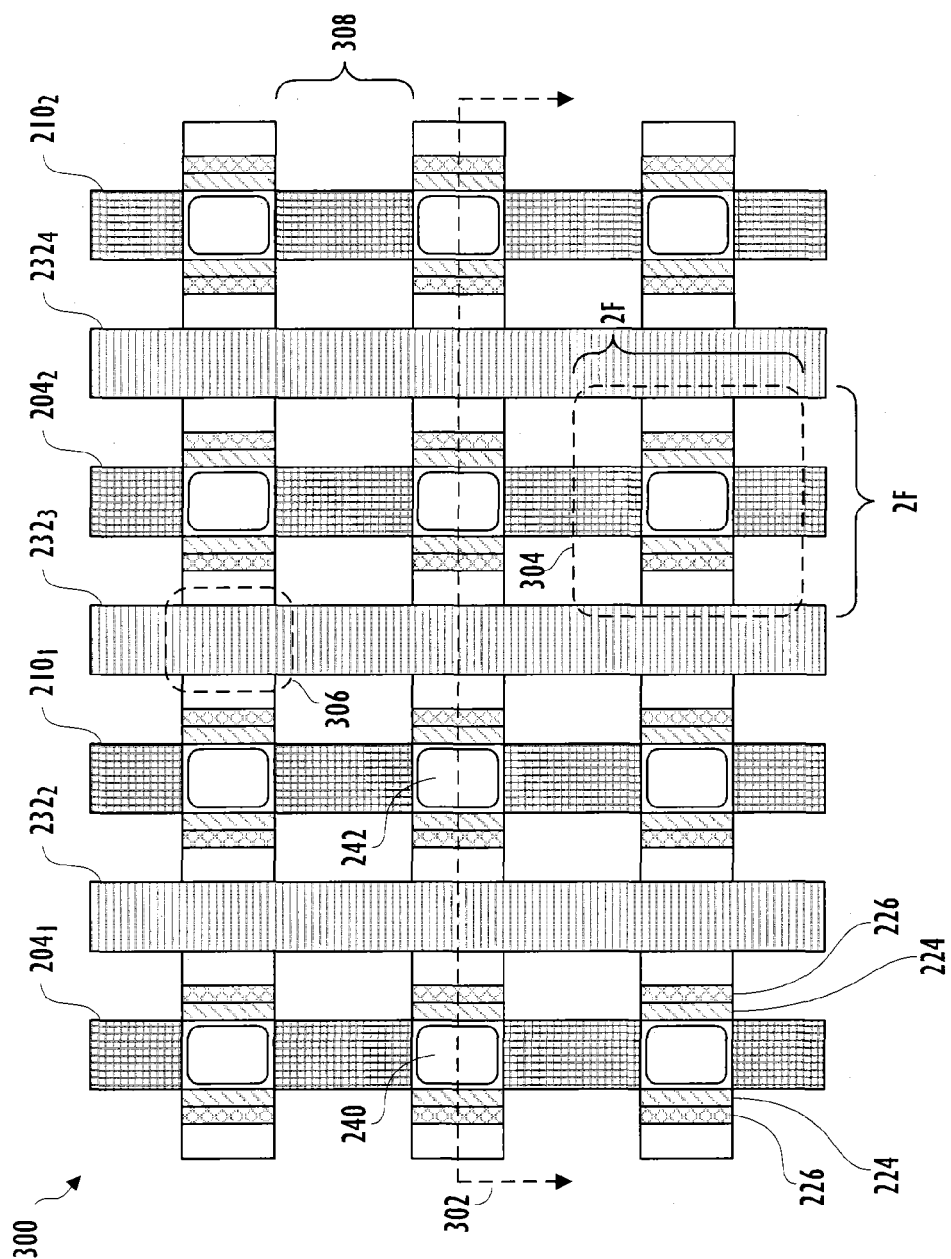
FIG. 3 is a plan view of a portion of a memory array according to an embodiment of the present disclosure.

FIG. 3 shows a plan view drawing of the portion of a memory array 300 according to one or more embodiments of the present disclosure, such as shown in FIG. 2A. For example, FIG. 2A is illustrated from the viewpoint of the view line 302 shown in FIG. 3. A string 212 architecture according to various embodiments facilitates an effective cell size of between 2 $F^2$/n and 3 $F^2$/n, where n is the number of memory tier stacked together and F is the minimum feature size. For example, the dashed line 304 encompasses two memory cell locations, such as that shown in FIG. 2A at 222. The approximate dimensions of the enclosed dashed line 304 are 2 F by 2 F. Thus, various embodiments according to the present disclosure may facilitate a reduced effective cell size from the typical effective cell size of approximately 4 $F^2$/n, for example. It should be noted that the bit lines 216 and source lines 214 such as shown in FIG. 2A have been omitted in FIG. 3 to improve readability of the Figure. However, the contact locations such as bit line contact point 240 and source line contact point 242 as shown in FIG. 2A are shown in FIG. 3 to indicate the point of contact of these structures.

The string select gate signal lines 232 of FIG. 2A are also depicted in FIG. 3. For example, the region encompassed by dashed line 306 might represent a string select gate structure such as the string select gates 232 shown in FIG. 2A. Further illustrated in FIG. 3 is the channel structure 226 and charge storage structure 224 as discussed above with respect to FIG. 2A. In addition, conductors coupling the drain select gates 204 and source select gates 210 are also shown in FIG. 3. Thus, the three-dimensional structure of a memory array according to various embodiments of the present disclosure can be visualized by reference to FIGS. 2 and 3, for example. It should be noted that some detail has been omitted from FIG. 3 to improve readability of the Figure.

Figure 4A:
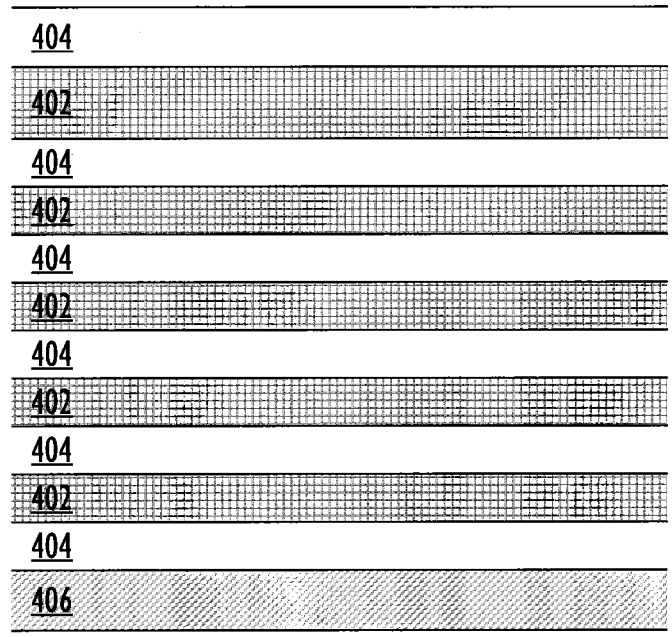
FIGS. 4A-4F illustrate a method of forming a portion of a memory array according to an embodiment of the present disclosure.

FIGS. 4A-4F illustrate a sequence of steps for forming a portion of a memory array according to various embodiments of the present disclosure. FIG. 4A shows an initial formation of alternating layers of both conducting and insulating material. Layers 402 might comprise polycrystalline silicon (commonly referred to as polysilicon), whereas layers 404 might comprise a silicon oxide ($SiO_x$) material, for example. The alternating layers comprising the stack shown in FIG. 4A might be formed on a conductive substrate 406, such as in an embodiment utilizing a plane gate structure such as discussed above with respect to FIG. 2A, for example. According to additional embodiments, the layer 406 might comprise a substrate structure according to one or more embodiments not utilizing a plane gate structure, for example.

Figure 4B:
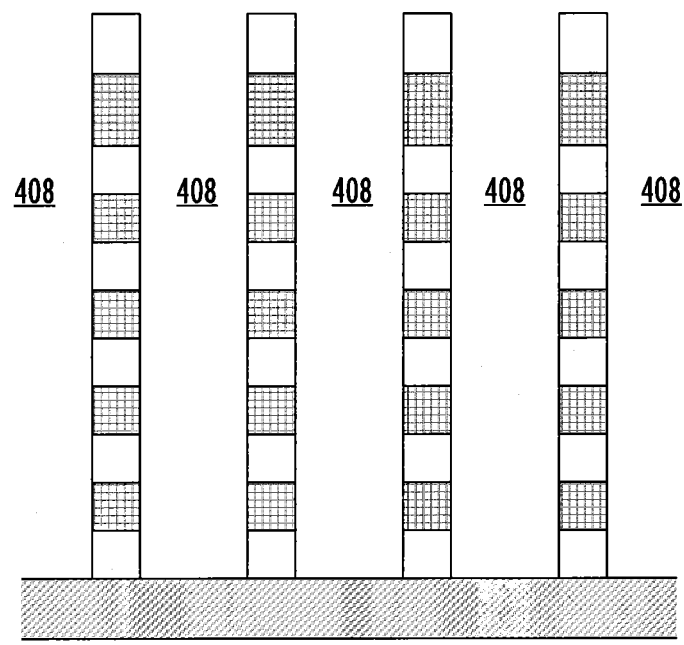

FIG. 4B illustrates a resulting structure following removal (e.g., etching) performed to facilitate a word line cut operation on the stack shown in FIG. 4A resulting in the voids 408. Following the word line cut operation depicted in FIG. 4B, a layer 424 may be formed. Layer 424 might serve as a charge storage structure for memory cell transistors and source/drain select gates. Although not shown in the Figure, layer 424 might comprise a stack of a first deposited charge blocking dielectric followed by a deposited charge trapping material followed by a tunnel dielectric. For example, a blocking dielectric and a tunnel dielectric material might comprise a silicon oxide, such as oxide $SiO_x$. The charge trapping material might comprise a silicon nitride material, for example.

Figure 4C:
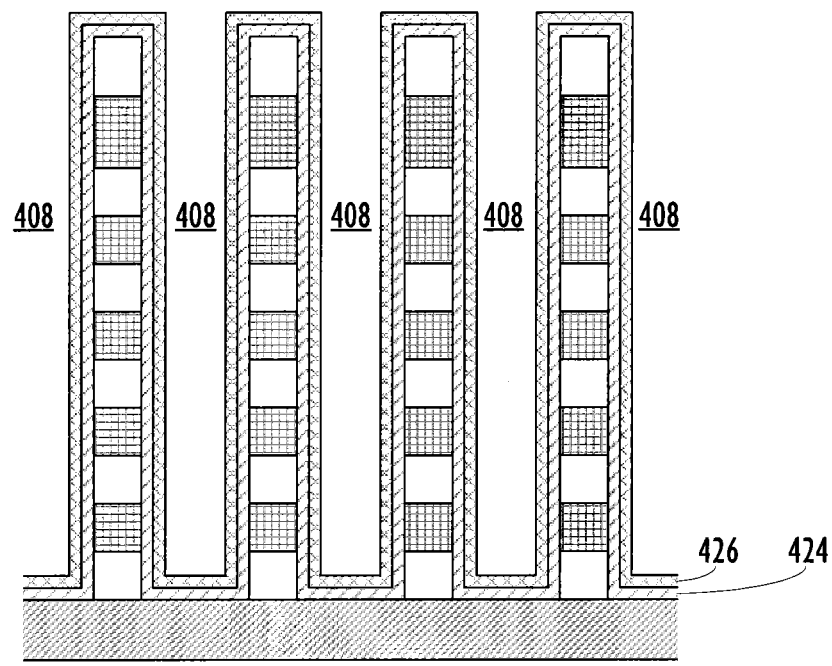

Layer 426 as shown in FIG. 4C is formed following the deposition of the gate stack layer 424. For example, layer 426 might serve as a channel structure for each memory cell transistor, source/drain select gates and string select gate of a particular string. Layer 426 might comprise a deposited film of polysilicon thus forming a transistor body, for example. Following the formation of layer 424 and layer 426, an additional cut operation (e.g., string cut) (not shown) is performed to create separate planes of memory cells according to various embodiments of the present disclosure. For example, the string cut operation might be performed to remove material to create the separation 308 shown between two planes of string structures as illustrated in FIG. 3, for example.

Figure 4D:
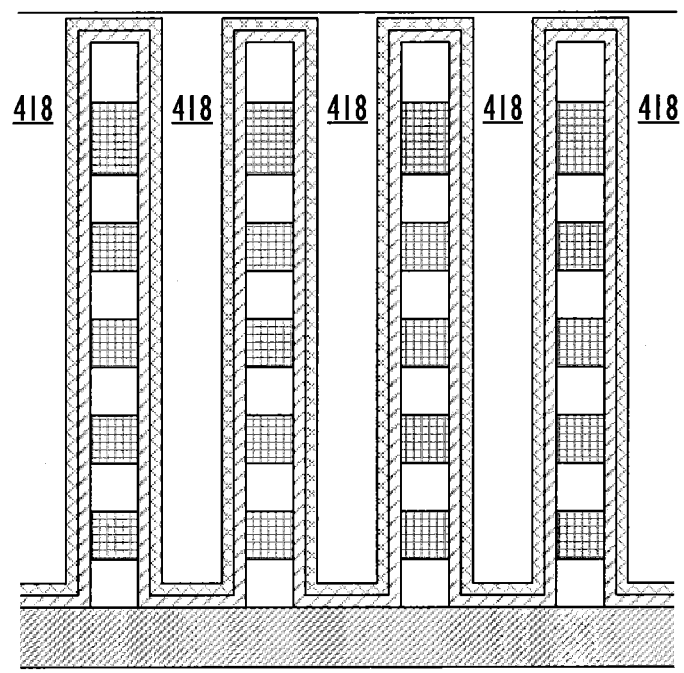
Figure 4E:
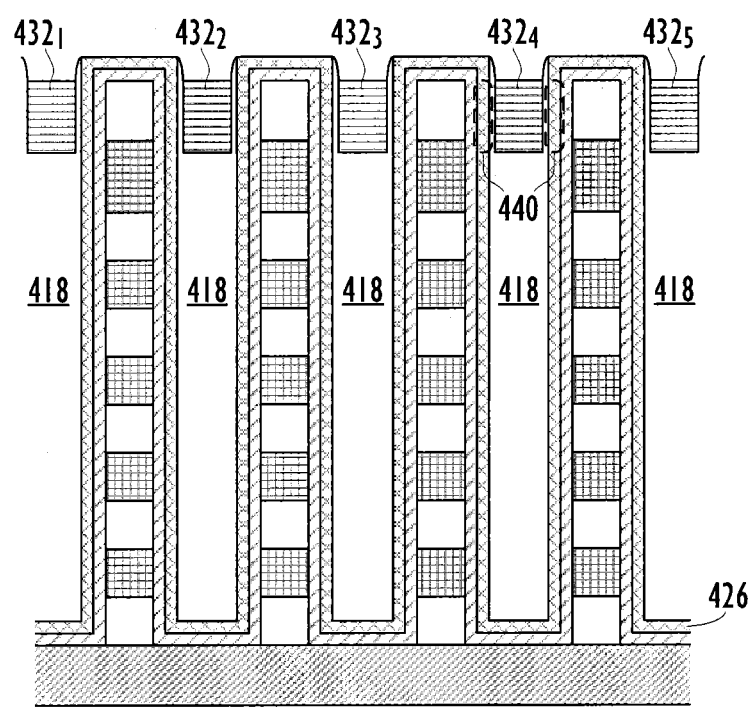

FIG. 4D illustrates formation of a dielectric, e.g., an oxide deposition (e.g., $SiO_x$), 418 to fill in the voids 408 between each column shown in FIGS. 4B and 4C. FIG. 4E illustrates a result of a removal (e.g., etch) operation performed to remove a portion of the dielectric 418, followed by formation of the string select gate structures 432. The string select gate structures 432 are generally conductors and might be formed from polysilicon, for example. The regions of layer 426 on either side of each string select gate structure 432, such as indicated in FIG. 4E by two dashed line ovals 440, might provide two channel structures for each string select gate structure according to various embodiments of the present disclosure, for example.

Figure 4F:
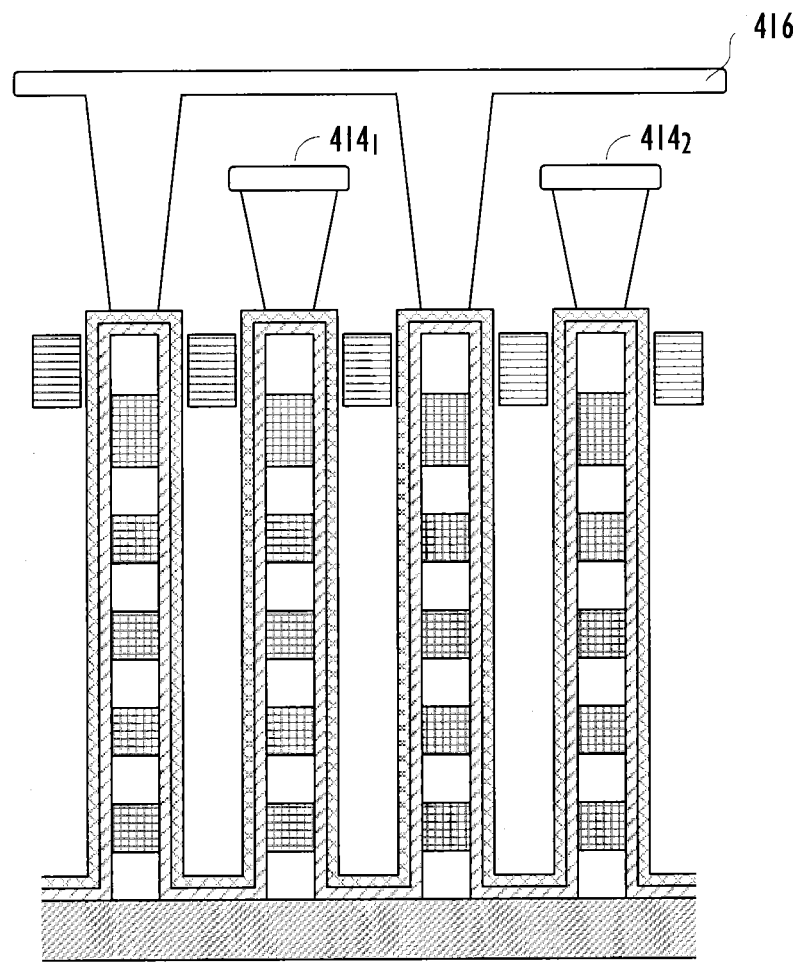

Following the formation of the string select gate structures 432, additional fabrication operations are performed to form the bit line 416 and source lines 414 structures as shown in FIG. 4F. Although not shown, it should be noted that additional fabrication operations might have been performed throughout the steps discussed with respect to FIGS. 4A-4F, such as formation of adhesion or barrier layers as desired or formation of peripheral devices. These additional operations have been omitted from the Figures to focus on particular structures, such as the string select gate structures 432, according to various embodiments of the present disclosure.

Figure 5:
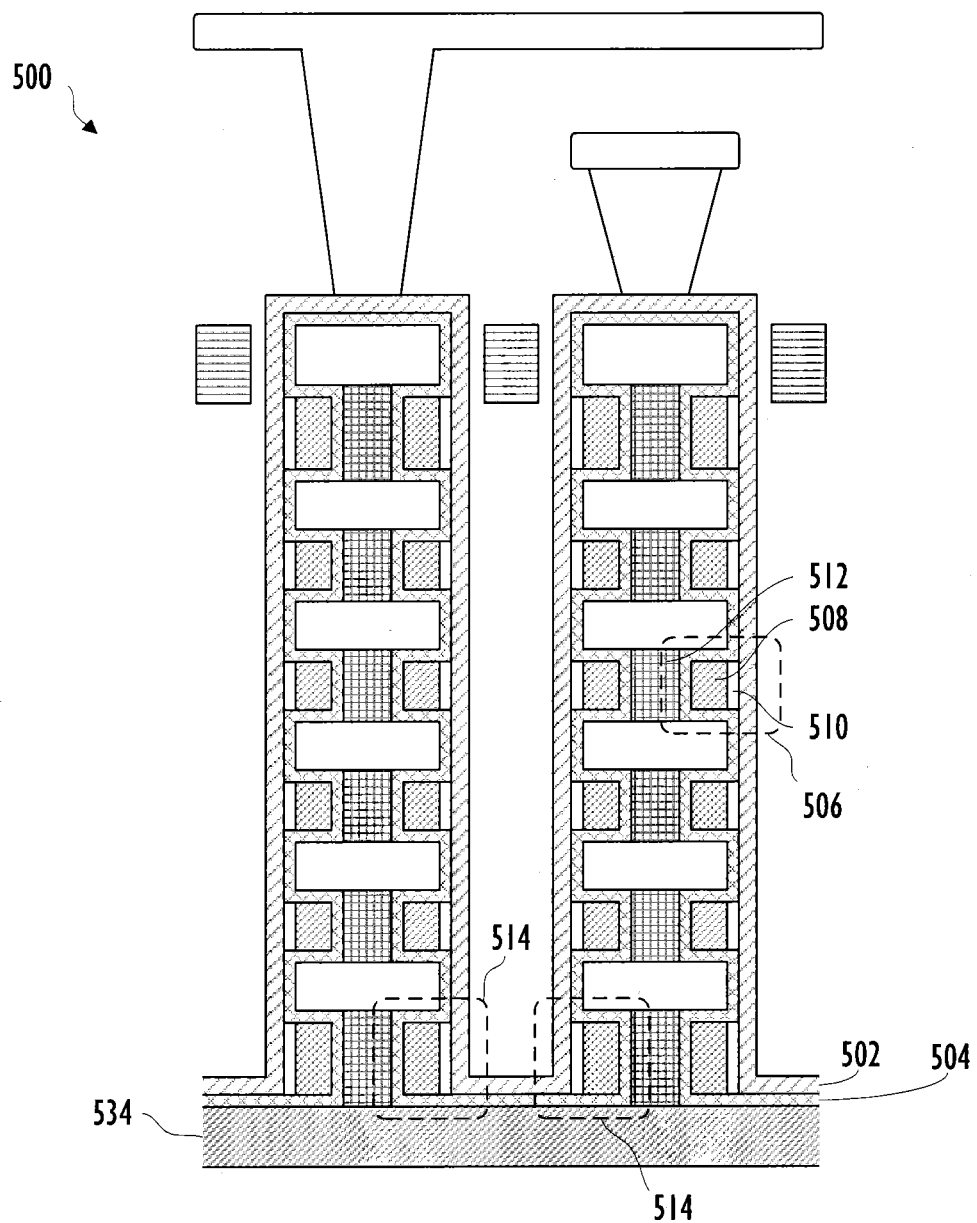
FIG. 5 illustrates a cross-sectional view of a portion of a memory array according to an embodiment of the present disclosure.

FIG. 5 illustrates a cross-sectional view of a portion of a memory array 500 according to an additional embodiment of the present disclosure. Each memory cell, such as indicated by region 506, might comprise an isolated floating gate structure instead of a continuous charge storage structure, such as the continuous charge storage structure 224 shown in FIG. 2, for example. According to one or more embodiments of the present disclosure, each memory cell 506 might comprise at least a portion of a word line 512, an intergate dielectric layer 504, a floating gate 508, a tunnel dielectric 510, and a channel layer 502.

FIG. 5 further illustrates memory cells, such as indicated by regions 514, which might be present in an array according to various embodiments of the present disclosure. Memory cells 514 might comprise active memory cells, such as memory cells 506, for example. According to additional embodiments, each string of memory cells might comprise memory cell structures 514 such as non-active or 'dummy' memory cells, which might be located at the bottom of each string as shown in FIG. 5. These additional memory cell structures might also be located at the top (not shown) of each string of memory cells according to one or more embodiments of the present disclosure. The plane gate 534 might be similar in configuration and structure to the plane gate 234 described above with respect to FIG. 2A.

Figure 6:
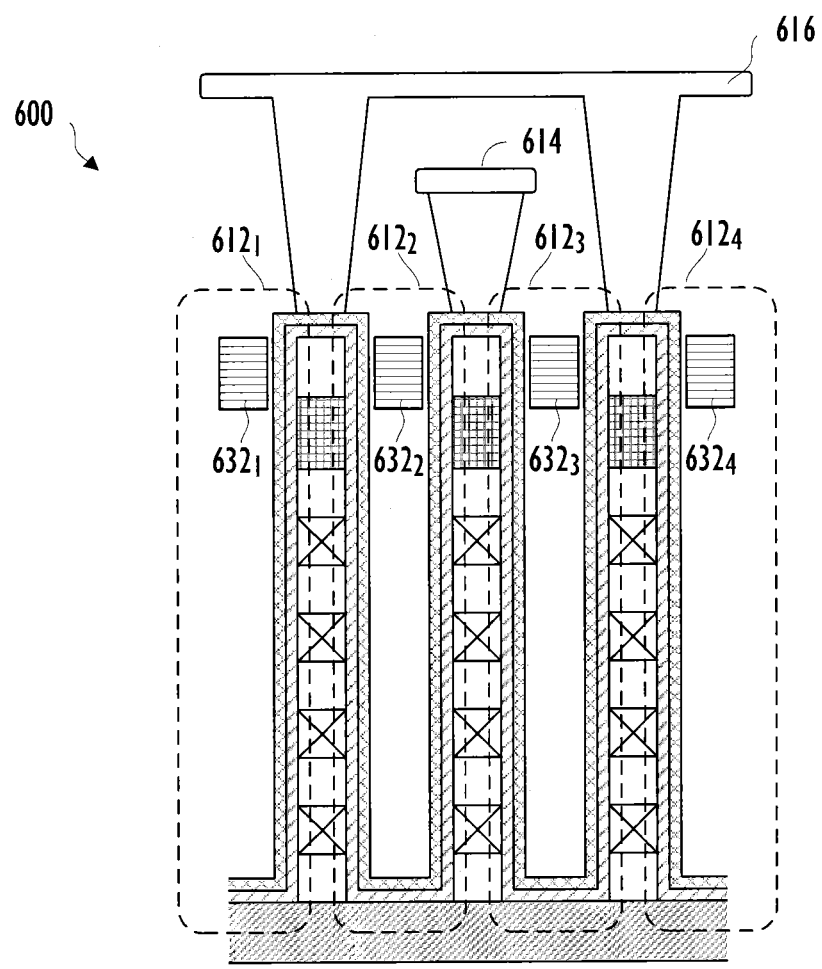
FIG. 6 is a cross-sectional view of a portion of a memory array according to an embodiment of the present disclosure.

FIG. 6 illustrates a similar vertical arrangement of memory cells such as those shown in FIG. 2A. FIG. 6 provides further description of functionality of the string select gates 632 and selecting particular strings 612 according to various embodiments of the present disclosure. It should be noted that only a portion (e.g., ½) of memory strings $612_1$ and $612_4$ are shown in FIG. 6. A particular string (e.g., selected string) such as string $612_2$ might be selected for a particular memory device operation. Examples of such memory device operations may include read, programming and erase operations. By way of example, a particular memory cell of string $612_2$ might be selected for a read operation. Thus, according to one or more embodiments, the string select gate $632_2$, is activated (e.g., biased) in order to couple a first end of the selected string $612_2$ to the bit line 616 and the other end of the selected string to the source line 614. The string select gate $632_2$ corresponding to the selected string $612_2$ might be biased to 5V in order to activate the string select gate, for example. According to this example, the string select gates $632_1$ and $632_3$ might be biased (e.g., to 0V) so as to deactivate those gates during the read operation performed on the selected memory string $612_2$, for example.

Subsequent to the read operation performed on selected memory string $612_2$ discussed above, string $612_3$ might next be selected for a read operation to be performed on a memory cell comprising that string. Thus, the string select gate $632_3$ corresponding to presently selected string $612_3$ might be biased to enable the string select gate $632_3$. The activation of string select gate $632_3$ couples the first end of the presently selected string $612_3$ to the bit line 616 and concurrently couples the other end of the string $612_3$ to its associated source line 614. Concurrent with the present activation of string select gate $632_3$ corresponding to string $612_3$, string select gates $632_2$ and $632_4$ are deactivated thus concurrently decoupling their respective strings $612_2$ and $612_4$ from their associated bit line 616 and from their respective source lines (the source line associated with string $612_4$ is not shown.)

Figure 7:
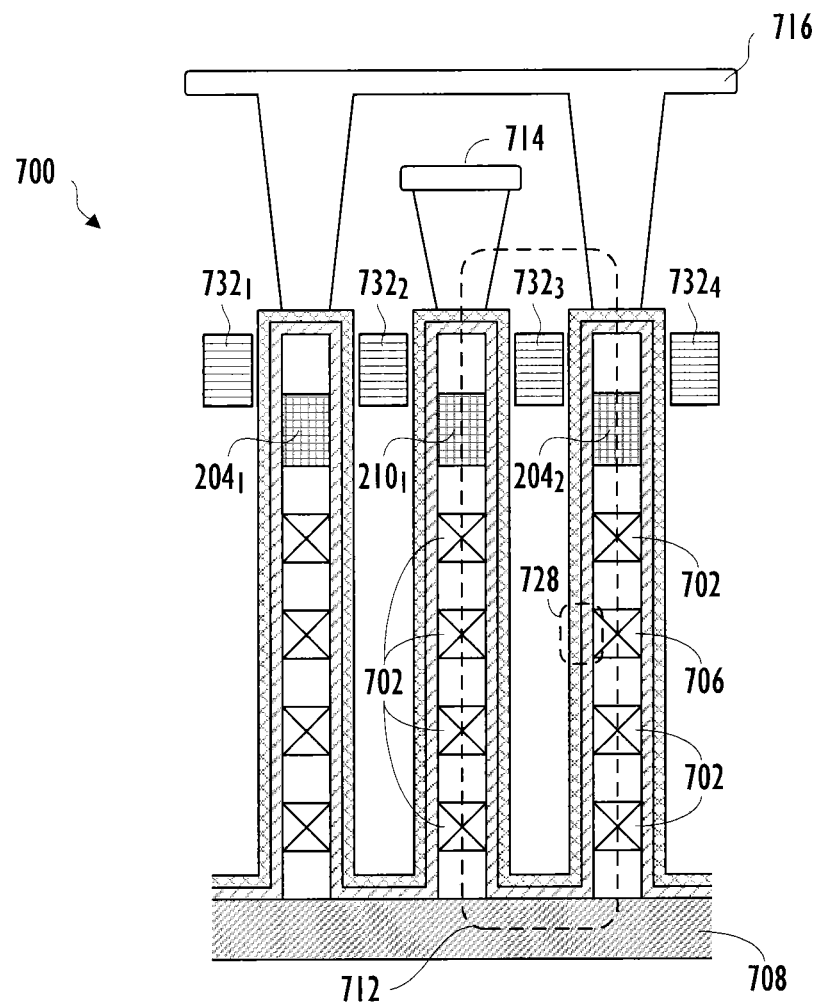
FIG. 7 is a cross-sectional view of a portion of a memory during a programming operation according to an embodiment of the present disclosure.

A memory device operation, such as a programming operation according to one or more embodiments of the present disclosure might be described by way of reference to FIG. 7. FIG. 7 shows a portion of an array of memory cells 700, such as is similarly shown in FIG. 2A, according to various embodiments of the present disclosure. By way of example, a memory cell location 728 comprising a memory cell of a selected string 712 might have been selected for a programming operation to be performed. As discussed above, one or more programming pulses might be applied to word line 706. Following one or more of the applied programming pulses a verify operation might be performed to determine if the selected memory cell has achieved its intended programming state.

During the application of the one or more programming pulses to the selected word line 706, the remaining word lines 702 of the selected string 712 might be biased to a particular Vpass potential. Vpass might be 10V, for example. In order to select only the selected string 712, the string select gate $732_3$ associated with the selected string 712 might be biased to activate the string select gate. In addition the drain select gate $204_2$ might also be activated during the programming operation. The string select gate $732_3$ and the drain select gates might be activated by biasing the gates to 10V, for example. String select gates $732_2$ and $732_4$ along with source select gate $210_1$ are biased so as to deactivate these gates. These gates might be deactivated by biasing them to 0V, for example. Further, during the present programming operation, the source line 714 might be biased to a particular voltage, such as Vcc, for example. Bit line 716 might be biased to a ground potential. Bit line 716 might alternatively be biased to Vcc. The plane gate 708 might be biased to a voltage such as the Vpass voltage applied to word lines 702 according to embodiments utilizing a plane gate structure, for example.

Figure 8:
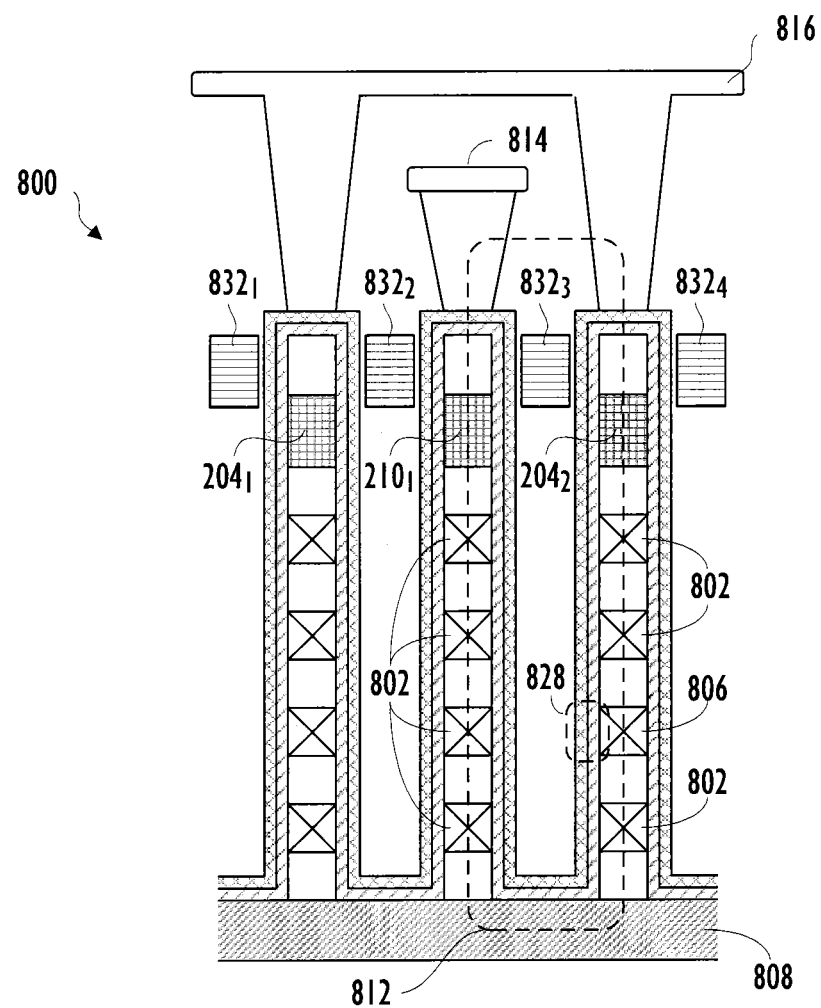
FIG. 8 is a cross-sectional view of a portion of a memory array during a read operation according to an embodiment of the present disclosure.

A memory device operation, such as a read operation according to one or more embodiments of the present disclosure might be described by way of reference to FIG. 8. FIG. 8 shows a portion of an array of memory cells 800, such as is similarly shown in FIG. 2A, according to various embodiments of the present disclosure. By way of example, a memory cell location 828 comprising a memory cell of selected string 812 might have been selected for a read operation to be performed.

During a read operation to be performed on the selected memory cell 828 of the selected string 812, a particular read voltage is applied to the selected word line 806. For example, the read voltage might be 0V. During the read operation, the remaining word lines 802 of the selected string 812 are biased to a particular Vpass potential in order to operate the associated memory cells in a "pass through" mode. Vpass might be 6V, for example. Embodiments according to the present disclosure incorporating a plane gate structure 808 might bias the plane gate to the Vpass potential during the read operation. The string select gate $832_3$ associated with the selected string 812 along with the drain select gate $204_2$ and the source select gate $210_1$ might be biased to activate these gates during the read operation. Source line 814 might be biased to a ground potential while the bit line 816 might be biased to a particular bit line potential. The particular bit line potential might be Vcc according to one or more embodiments, for example. The string select gates $832_1$, $832_2$ and $832_4$ that are not associated with the selected string 812 might be biased so as to deactivate these gates during the read operation. Drain select gate $204_1$ might also be deactivated during the read operation, for example.

Figure 9:
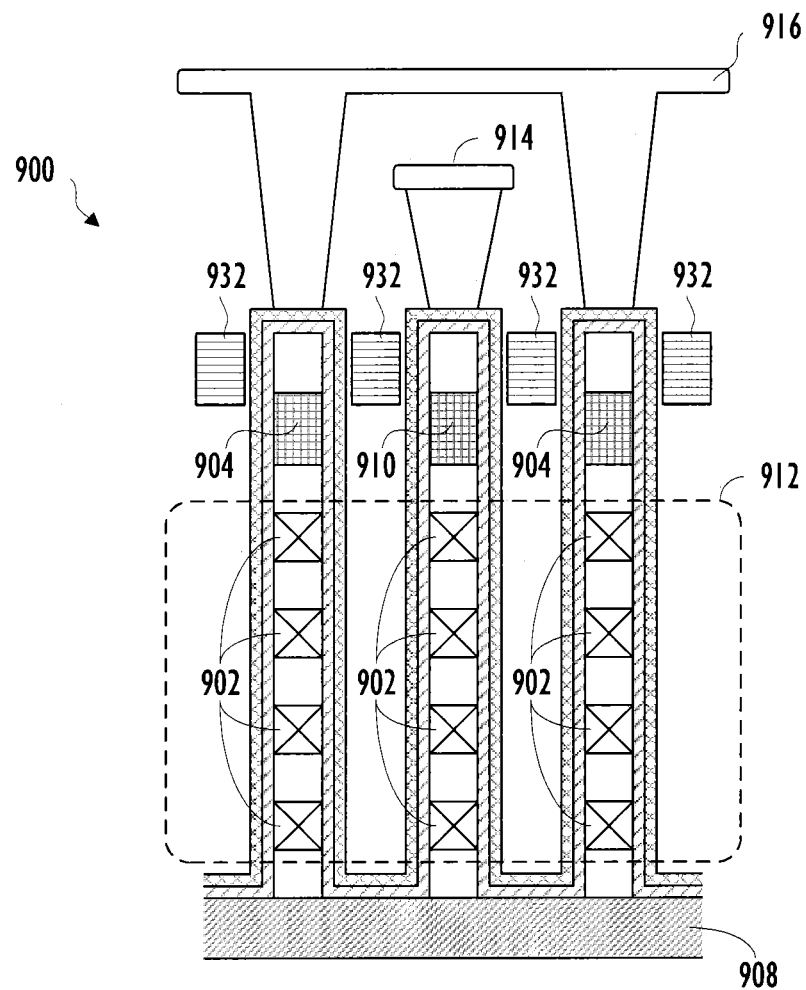
FIG. 9 is a cross-sectional view of a portion of a memory array during an erase operation according to an embodiment of the present disclosure.

An erase operation to be performed on a memory device according to one or more embodiments of the present disclosure might be discussed by way of reference to FIG. 9, for example. FIG. 9 shows a portion of an array of memory cells 900, such as is similarly shown in FIG. 2A, according to various embodiments of the present disclosure. By way of example, the memory locations 912 comprising a group (e.g., block) of memory cells might have been selected to be erased.

During the erase operation, each word line 902 might be biased to a ground potential, for example. Bit line 916 and source line 914 might be biased to a particular Verase potential. Verase might be 20V, for example. String select gate 932, source select gate 910 and drain select gate 904 might be biased to a potential near the Verase potential. Additionally, string select gate 932 might be biased to a potential (e.g., near the Verase potential) which is different from a potential that the source select gate 910 and drain select gate 904 might be biased to according to one or more embodiments of the present disclosure. Embodiments comprising a plane gate 908 might bias the plane gate similarly as each of the word lines 902 are biased during the erase operation, for example. It should be noted that various embodiments according to the present disclosure are not limited to the voltages described with reference to FIGS. 7-9. Other bias voltages might be utilized, for example.

Figure 10:
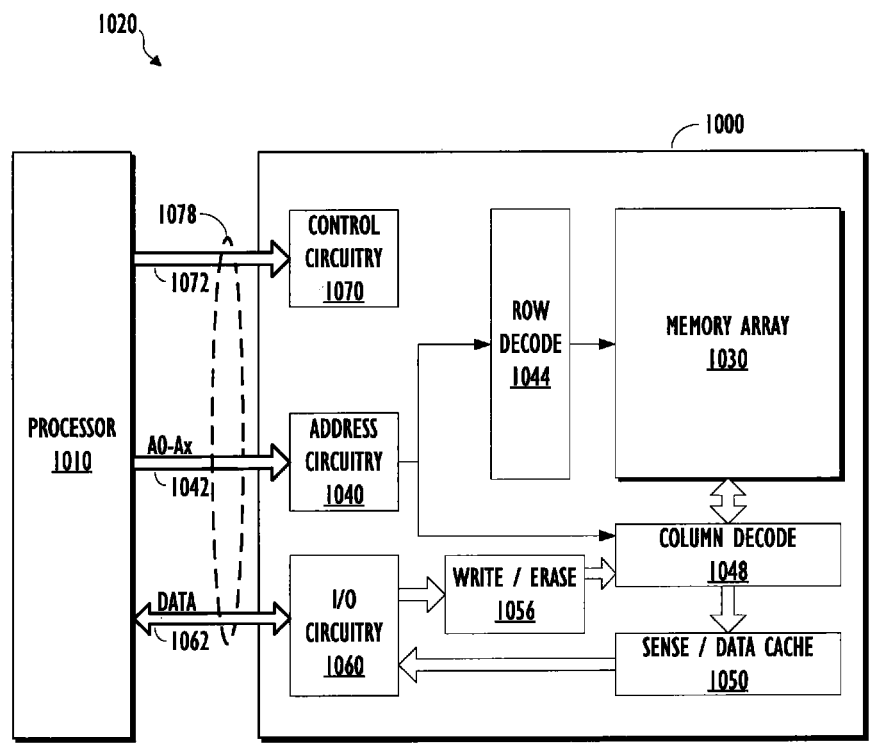
FIG. 10 is a simplified block diagram of a memory device coupled to a host as part of an electronic system according to an embodiment of the present disclosure.

FIG. 10 is a functional block diagram of an electronic system having at least one memory device according to one or more embodiments of the present disclosure. The memory device 1000 illustrated in FIG. 10 is coupled to a host such as a processor 1010. The processor 1010 may be a microprocessor or some other type of controlling circuitry. The memory device 1000 and the processor 1010 form part of an electronic system 1020. The memory device 1000 has been simplified to focus on features of the memory device that are helpful in understanding various embodiments of the present disclosure.

The memory device 1000 includes one or more arrays of memory cells 1030 that might be logically arranged in banks of rows and columns. According to one or more embodiments, the memory cells of memory array 1030 are flash memory cells. The memory array 1030 might include multiple banks and blocks of memory cells residing on a single or multiple die as part of the memory device 1000. Memory array 1030 may comprise SLC and/or MLC memory, for example. The memory cells of the memory array 1030 may also be adaptable to store varying densities (e.g., MLC (four level) and MLC (eight level)) of data in each cell, for example.

An address buffer circuit 1040 is provided to latch address signals provided on address input connections A0-Ax 1042. Address signals are received and decoded by a row decoder 1044 and a column decoder 1048 to access the memory array 1030. Row decoder 1044 might comprise driver circuits configured to drive the word lines, string select gates and one or more plane gates according to various embodiments of the present disclosure, for example. It will be appreciated by those skilled in the art, with the benefit of the present description, that the number of address input connections 1042 depends on the density and architecture of the memory array 1030. That is, the number of address digits increases with both increased memory cell counts and increased bank and block counts, for example.

The memory device 1000 reads data in the memory array 1030 by sensing voltage or current changes in the memory array columns using sense devices, such as sense/data cache circuitry 1050. The sense/data cache circuitry 1050, in at least one embodiment, is coupled to read and latch a row of data from the memory array 1030. Data input and output (I/O) buffer circuitry 1060 is included for bi-directional data communication over a plurality of data connections 1062 with the processor 1010. Write/erase circuitry 1056 is provided to write data to or to erase data from the memory array 1030.

Control circuitry 1070 is configured at least in part to implement various embodiments of the present disclosure, such as facilitating control of the string select gates discussed above, for example. In at least one embodiment, the control circuitry 1070 may utilize a state machine. Control signals and commands can be sent by the processor 1010 to the memory device 1000 over the command bus 1072. The command bus 1072 may be a discrete signal or may be comprised of multiple signals, for example. These command signals 1072 are used to control the operations on the memory array 1030, including data read, data program (e.g., write), and erase operations. The command bus 1072, address bus 1042 and data bus 1062 may all be combined or may be combined in part to form a number of standard interfaces 1078. For example, the interface 1078 between the memory device 1000 and the processor 1010 may be a Universal Serial Bus (USB) interface. The interface 1078 may also be a standard interface used with many hard disk drives (e.g., SATA, PATA) as are known to those skilled in the art.

The electronic system illustrated in FIG. 10 has been simplified to facilitate a basic understanding of the features of the memory and is for purposes of illustration only. A more detailed understanding of internal circuitry and functions of non-volatile memories are known to those skilled in the art.

CONCLUSION

Memory devices have been described utilizing NAND strings of serially-connected non-volatile memory cells wherein one or more strings each have an associated string select gate. The strings include two or more serially-connected memory cells where a first portion of each string is formed along a first column and a second portion is formed along a second column. A string select gate associated with each string is configured to concurrently selectively couple a first end of the associated string to a bit line and a second end of the associated string to a source line. According to one or more embodiments, one or more strings are formed in a U shaped arrangement wherein each string comprises a string select gate formed between each end of the U shaped string.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A string of memory cells, comprising:
   one or more first memory cells;
   one or more second memory cells; and
   a string select gate having a first channel structure and a second channel structure;
   wherein the one or more first memory cells and the one or more second memory cells are serially-connected to collectively define the string of memory cells; and
   wherein the string select gate is configured to concurrently selectively couple a first end of the string of memory cells to a data line through the first channel structure and a second end of the string of memory cells to a source line through the second channel structure.

2. The memory device of claim 1, wherein the string of serially-connected memory cells comprises a NAND string of serially-connected memory cells.

3. The memory device of claim 1, wherein the string of serially-connected memory cells comprises a first stack of vertically formed memory cells and a second stack of vertically formed memory cells.

4. The memory device of claim 3, wherein the first stack and the second stack of memory cells each comprise an equal number of memory cells.

5. The memory device of claim 4, wherein the number of memory cells in the first stack and the second stack of memory cells is equal to $2^N$, where N is an integer.

6. The memory device of claim 3, wherein the string select gate is formed between the first end and the second end of the string.

7. The memory device of claim 3, wherein the first stack and the second stack are formed on a semiconductor substrate and are further formed adjacent to each other.

8. The memory device of claim 3, further comprising a control gate formed at a bottom of the first stack and at a bottom of the second stack where the control gate is configured to selectively couple the bottom of each stack together.

9. The memory device of claim 3, wherein the first stack and the second stack of memory cells each comprise one or more non-active memory cells.

10. The memory device of claim 1, wherein the string select gate comprises a single gate comprising two channel regions.

11. The memory device of claim 1, wherein the string of serially-connected memory cells is configured in a U shaped arrangement.

12. The memory device of claim 1, further comprising:
    a drain select gate formed at the first end of the string; and
    a source select gate formed at the second end of the string;
    wherein the string select gate is further configured to concurrently selectively couple both the drain select gate to the data line and the source select gate to the source line.

13. A memory device, comprising:
    a data line;
    a source line;
    a first stack of series coupled memory cells;
    a second stack of series coupled memory cells adjacent the first stack where a first end of the first stack is selectively coupled to a first end of the second stack; and
    a string select gate formed between a second end of the first stack and a second end of the second stack and having a first channel structure and a second channel structure, wherein the string select gate is configured to concurrently selectively couple the second end of the first stack to the data line through the first channel structure and the second end of the second stack to the source line through the second channel structure.

14. The memory device of claim 13, wherein the first stack of series coupled memory cells comprises an equal number of memory cells as the second stack of series coupled memory cells.

15. The memory device of claim 13, wherein the first stack and the second stack each comprise vertically formed columns formed on a semiconductor substrate.

16. A memory device, comprising:
    a data line;
    a source line;
    a first string of series coupled memory cells formed along a first side of a first column and along a side of a second column, where the side of the second column is adjacent to the first side of the first column;
    a second string of series coupled memory cells formed along a second side of the first column and along a side of a third column, where the side of the third column is adjacent to the second side of the first column;
    a first string select gate formed between a top end of the first column and a top end of the second column and having a first channel structure between the first string select gate and the first column and a second channel structure between the first string select gate and the second column; and
    a second string select gate formed between a top end of the first column and a top end of the third column and having a first channel structure between the second string select gate and the first column and a second channel structure between the second string select gate and the third column;
    wherein the first string select gate is configured to couple the top end of the first column to the source line and to couple the top end of the second column to the data line when the first string select gate is activated; and
    wherein the second string select gate is configured to couple the top end of the first column to the source line and to couple the top end of the third column to the data line when the second string select gate is activated.

17. The memory device of claim 16, further comprising:
    control circuitry, wherein the control circuitry is configured to independently activate and deactivate the first and the second string select gates.

18. The memory device of claim 17, wherein the control circuitry is further configured to deactivate the first string select gate when the second string select gate is activated, and to deactivate the second string select gate when the first string select gate is activated.

19. The memory device of claim 17, further comprising a plane gate, wherein the first, second and third columns are vertically formed on the plane gate.

20. The memory device of claim 19, wherein the plane gate is configured to couple a bottom end of the first column to a bottom end of the second column, and to couple the bottom end of the first column to a bottom end of the third column, when the plane gate is activated.

21. The memory device of claim 20, wherein the control circuitry is further configured to activate the plane gate when either the first string select gate or the second string select gate is activated.

22. The memory device of claim 17, wherein the control circuitry is further configured to perform a memory device operation where the memory device operation is selected from a group consisting of a read operation, a write operation, and an erase operation.

23. A memory device, comprising:
   a data line;
   a first source line;
   a second source line;
   a first string of series coupled memory cells formed along a first side of a first column and along a side of a second column, where the side of the second column is adjacent to the first side of the first column;
   a second string of series coupled memory cells formed along a second side of the first column and along a side of a third column, where the side of the third column is adjacent to the second side of the first column;
   a first string select gate formed between a top end of the first column and a top end of the second column and having a first channel structure between the first string select gate and the first column and a second channel structure between the first string select gate and the second column; and
   a second string select gate formed between a top end of the first column and a top end of the third column and having a first channel structure between the second string select gate and the first column and a second channel structure between the second string select gate and the third column;
   wherein the first string select gate is configured to couple the top end of the first column to the data line and to couple the top end of the second column to the first source line when the first string select gate is activated; and
   wherein the second string select gate is configured to couple the top end of the first column to the data line and to couple the top end of the third column to the second source line when the second string select gate is activated.

24. The memory device of claim 23, further comprising:
   control circuitry, wherein the control circuitry is configured to independently activate and deactivate the first and the second string select gates.

25. A memory device, comprising:
   a data line;
   a source line;
   a first column formed vertically on a semiconductor substrate, wherein the first column comprises a first string of serially-connected memory cells formed along a vertical wall of the first column;
   a second column formed vertically on the semiconductor substrate, wherein the second column comprises a second string of serially-connected memory cells formed along a vertical wall of the second column adjacent to the first string of serially-connected memory cells; and
   a string select gate, wherein the string select gate is formed between a top portion of the first column and a top portion of the second column and comprises a first channel structure between the string select gate and the first column and a second channel structure between the string select gate and the second column;
   wherein the string select gate is configured to couple a top memory cell of first string to the data line and a top memory cell of the second string to the source line when the string select gate is activated.

26. The memory device of claim 25, wherein the string select gate is further configured to decouple the top memory cell of first string from the data line and to decouple the top memory cell of the second string from the source line when the string select gate is deactivated.

27. The memory device of claim 25, wherein a bottom memory cell of the first string of serially-connected memory cells is coupled to a bottom memory cell of the second string of serially-connected memory cells.

28. The memory device of claim 25, further comprising a control gate formed at least partially between the bottom memory cells of the first string and the second string of serially-connected memory cells.

29. The memory device of claim 28, wherein the control gate is configured to couple the bottom memory cells of the first string and the second string of serially-connected memory cells when the control gate is activated.

30. The memory device of claim 25, wherein the memory device further comprises one or more additional columns formed vertically on the semiconductor substrate, wherein the one or more additional columns each comprises a string of serially-connected memory cells formed along a vertical wall of the one or more additional columns.

31. The memory device of claim 30, wherein the memory device further comprises a plane gate formed under the first column, the second column and the one or more additional columns.

32. The memory device of claim 25, wherein the first string and the second string of serially-connected memory cells comprise a continuous channel structure formed between the top memory cell of the first string and the top memory cell of the second string of serially-connected memory cells.

33. The memory device of claim 32, wherein the first string and the second string of serially-connected memory cells further comprise a continuous charge storage structure formed between the top memory cell of the first string and the top memory cell of the second string of serially-connected memory cells.

34. The memory device of claim 32, wherein each memory cell of the first string and the second string of serially-connected memory cells each comprises an intergate dielectric layer, an isolated floating gate structure, and a tunnel dielectric layer.

35. A method of operating a memory device, the method comprising:
   activating a string select gate to couple a first end of a string of serially-connected memory cells to a data line through a first channel structure of the string select gate and to couple a second end of the string of serially-connected memory cells to a source line through a second channel structure of the string select gate when one or more memory cells of the string is selected for a memory device operation; and
   deactivating the string select gate to decouple the first end of the string of serially-connected memory cells from the data line and to decouple the second end of the string of serially-connected memory cells from the source line when no memory cell of the string of serially-connected memory cells is selected for a memory device operation.

36. The method of claim 35, wherein activating the string select gate when one or more memory cells of the string is selected for a memory device operation further comprises activating the string select gate when one or more memory cells of the string is selected for a memory device operation selected from the group consisting of a read operation, a write operation, and an erase operation.

37. A method of forming a string of serially-connected memory cells, the method comprising:

forming a first column and a second column over a semiconductor substrate, wherein the first and the second column each comprise alternating structures of dielectric and conductive material, and where the first and the second column are separated by a particular distance;

forming a continuous charge storage structure over the first and second columns and a region of the semiconductor substrate between the first and the second columns;

forming a continuous channel structure over the continuous charge storage structure; and forming a string select gate structure between a top structure of the alternating structures of the first column and a top structure of the alternating structures of the second column, wherein the string select gate is formed to concurrently selectively provide conductivity to a portion of the continuous channel structure between the string select gate structure and the top structure of the alternating structures of the first column, and to a portion of the continuous channel structure between the string select gate structure and the top structure of the alternating structures of the second column.

* * * * *